United States Patent [19]

Thome et al.

[11] Patent Number: 4,939,942

[45] Date of Patent: Jul. 10, 1990

[54] METHOD FOR MEASURING THE ACCURACY OF INSERTION EQUIPMENT

[75] Inventors: John R. Thome, Fort Worth; Sypyng B. Yu, Hurst, both of Tex.

[73] Assignee: Motorola, Inc.

[21] Appl. No.: 389,237

[22] Filed: Aug. 3, 1989

[51] Int. Cl.⁵ .............................................. G01M 19/00
[52] U.S. Cl. ..................................... 73/865.9; 29/407; 29/705
[58] Field of Search .................. 73/865.9; 29/705, 407

[56] References Cited

U.S. PATENT DOCUMENTS

| | | | |
|---|---|---|---|
| 2,959,848 | 11/1960 | Savitt | 29/407 |
| 3,466,762 | 9/1969 | Kirk et al. | 29/407 |
| 3,468,024 | 9/1969 | Yonkers | 29/705 X |
| 3,548,493 | 12/1970 | Hubbard | 29/407 X |
| 3,621,554 | 11/1971 | Feldman et al. | 29/407 X |
| 4,598,456 | 7/1986 | McConnell | 29/741 X |
| 4,610,084 | 9/1986 | Anderson et al. | 29/741 X |
| 4,622,740 | 11/1986 | Mirley, Jr. et al. | 29/705 X |
| 4,654,964 | 4/1987 | Schneider et al. | 29/705 |
| 4,768,285 | 9/1988 | Woodman, Jr. | 29/705 |

*Primary Examiner*—Tom Noland
*Attorney, Agent, or Firm*—Daniel K. Nichols

[57] ABSTRACT

A test board is provided with a plurality of cavities that are covered by a film and arranged in a know pattern to coincide with the components to be inserted. The component lead is inserted through the film and into the cavities on the test board. The component lead is removed from the test board. The location of the resulting hole in the film is measured and compared to its intended target to determine the accuracy of the insertion equipment.

9 Claims, 3 Drawing Sheets

METHOD FOR MEASURING THE ACCURACY OF INSERTION EQUIPMENT

TECHNICAL FIELD

This invention relates generally to the field of automated machines for the insertion of leaded components into thru-hole locations on printed circuit boards and more specifically to measuring the accuracy of component insertion equipment.

BACKGROUND ART

Automated machines, for the insertion of leaded components into thru-hole locations on printed circuit boards (PCB), have been in use for more than twenty years. In spite of the maturity of this type of equipment, the insertion process continues to be subject to a relatively high misinsertion rate. This observation is further emphasized by the fact that most machines are equipped to sense when component leads are not successfully inserted through the appropriate holes in the printed circuit boards and to stop the machine when component lead misinsertion occurs. Unfortunately, this fault protection procedure requires operator intervention to restart the machine, causes degradation in productivity of the process, and causes scrapping of a component on each retry. Often, the cause of the misinsertion is fundamental, requiring subsequent hand insertion of the component and associated potential for defects through the waveline or beyond. There are several fundamental reasons for this high misinsertion rate.

First, the insertion process itself is a relatively complex process subject to numerous sources of variation. These include the machine itself, the PCB, and the components. Within the PCB, the tooling holes used to register the board and the component holes designed to accommodate the component leads can and do vary independently. Within the insertion machine, both the X-Y table and the insertion head contribute independently to system variation. Finally component variation can occur in the accuracy of the spacing of the parts on the tape and reel, component body dimensions, lead dimensions, and lead composition or stiffness. The nature of all of these sources of variation is multifaceted and interdependent, making the activity of process optimization and problem solving extremely difficult. This difficulty is compounded by the lack of a method which can parametrically measure the accuracy of the total machine/component system separately from the PCB part of the system.

Secondly, thru-hole insertion is intrinsically a more difficult process than, for instance, surface mounted component placement. To illustrate very simplistically, leaded parts require the insertion of a 0.024" diameter lead into a 0.042" diameter hole, giving a tolerance window of ±0.009". For chip placement, the same tolerance window is ±0.015" for SOT-23's and ±0.020" for chips. Thus the dimensional accuracy required to achieve the same quality level is significantly tighter for component insertion than it is for chip placement.

Lastly, the consequences of missing the target for insertion are different. A misinsertion stops the insertion machine regardless of the magnitude of the miss. For placement, a part marginally out of the tolerance window will usually result in acceptable soldering and will not cause the machine to stop.

Chip placement equipment has been availabe for about ten years. In spite of this significantly lower maturity, chip machines are more accurate than their insertion counterparts. One of the reasons that this is the case is that chip placement accuracy can be measured parametrically, allowing quick comparison of machine design alternatives. Until now, there has been no analogous capability for assessing insertion machine accuracy. Accordingly, a need exists to characterize parametrically, under use conditions, insertion machine accuracy.

SUMMARY OF THE INVENTION

Accordingly, it is an object of the present invention to provide a method to characterize parametrically the accuracy of component insertion equipment.

Briefly, according to the invention a test board is provided with a plurality of cavities that are covered by a film and arranged in a known pattern to coincide with the components to be inserted. The component lead is inserted through the film and into the cavities on the test board according to a desired pattern. The equipment to be measured is programmed to cause the component lead to be removed from the test board. The location of the resulting hole is measured and compared to the desired pattern to determine the accuracy of the insertion equipment.

BRIEF DESCRIPTION OF THE DRAWINGS

FIG. 4 is an illustration of the resulting holes in the film after the removal of the component leads in accordance with the present invention.

DETAILED DESCRIPTION OF THE PREFERRED EMBODIMENT

Figure 1:
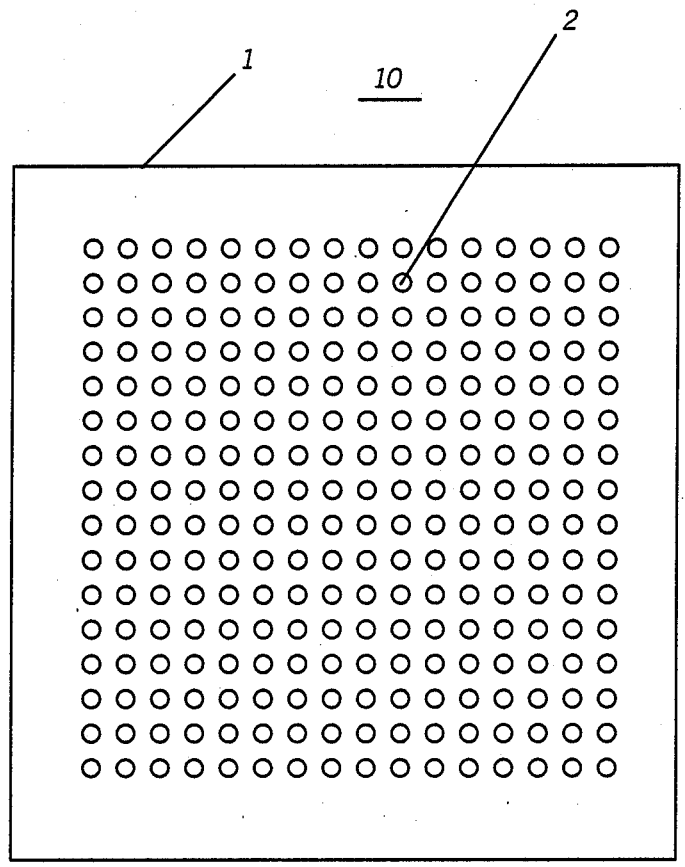
FIG. 1 is an illustration of a test board suitable for use with the present invention.

Referring to FIG. 1, a test board 10 is prepared as by drilling a plurality of cavities or holes 2 into a vector board 1 in a known pattern to coincide with the components to be inserted. The holes 2 are larger in diameter than the holes size normally used to retain the leaded components. The holes 2 may or may not go completely through the test board 10, but must be deeper than the length of the component leads. An alternative to drilling holes 2 into the test board 10 is to have holes 1 molded into the test board.

Figure 2:
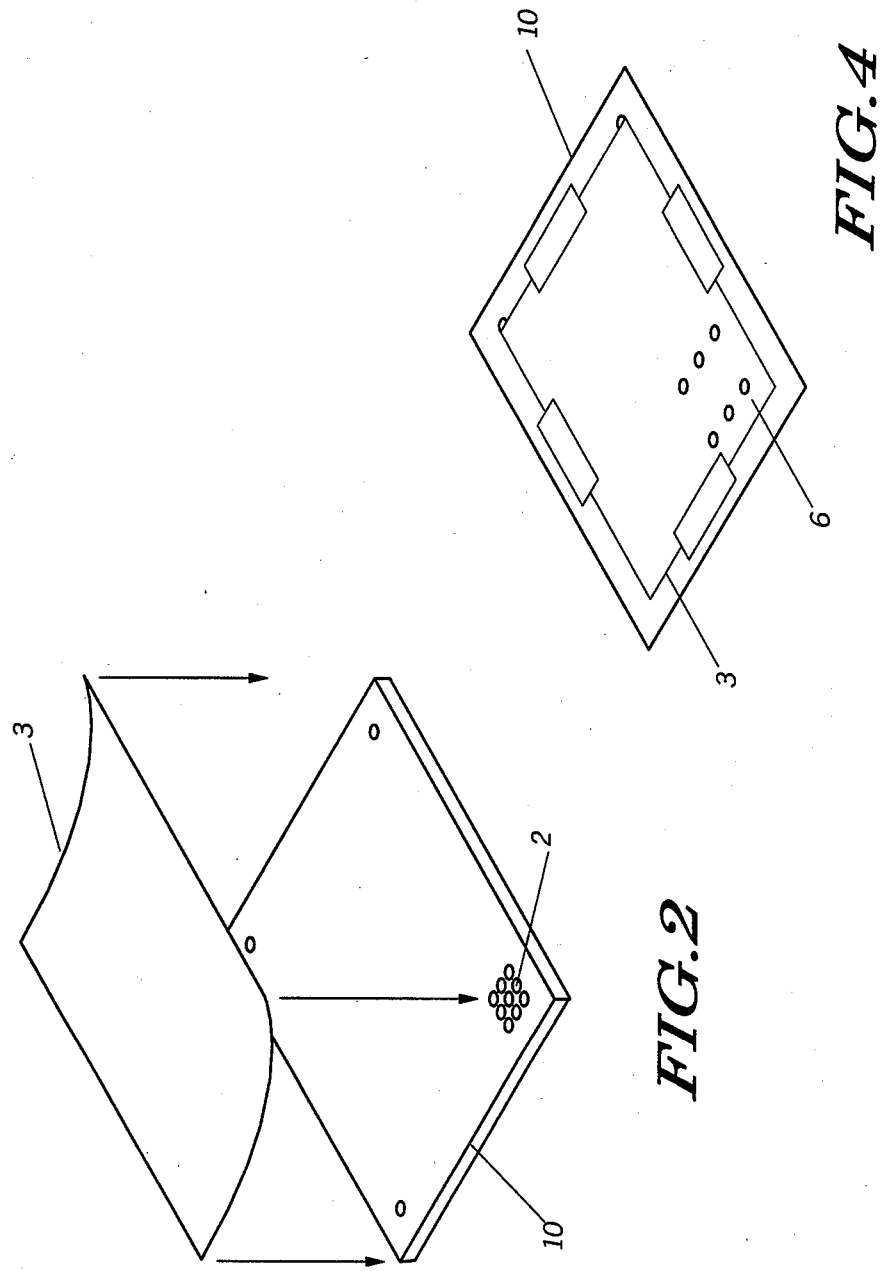
FIG. 2 is an illustration of covering the test board with a sheet of film in accordance with the present invention.

Referring to FIG. 2, a sheet of paper or a similar film 3 is laminated to the test board 10. Although paper is the preferred film, any film possessing properties similar to paper may be used. The properties include being rigid enough not to tear during the insertion and removal of the components and rigid enough to duplicate the shape of the lead resulting from the insertion of the leads. Also the film must have the property of being weak enough to be easily pierced by the component leads during insertion of the component lead. An alternative to laminating the film 3 to the test board 10 is to have the film 3 attached to a molded test board.

Figure 3:
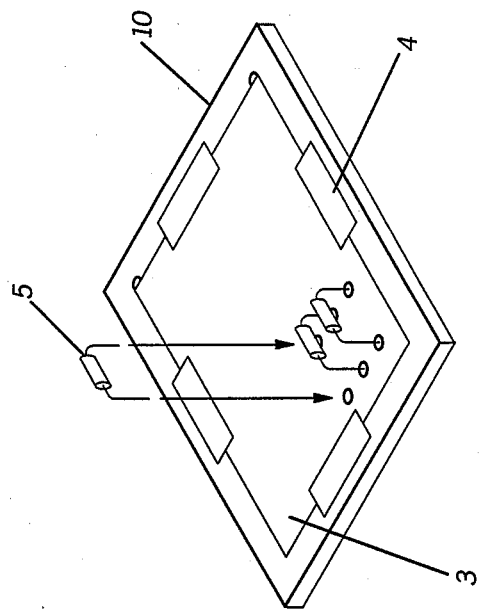
FIG. 3 is an illustration of the component leads being inserted into the test board in accordance with the present invention.

Referring to FIG. 3, the leading edge of the component 5 is inserted into the test board 10, through the film 3 and through the holes or into the cavities 2. The insertion equipment preferably is programmed not to clinch the component 5 after it has been inserted in the test board 10. Tape 4 can be used to secure the film 3 to the test board 10.

Referring to FIG. 4, the component 5 is remove from the test board 10. The location of the resulting holes in the film caused by the insertion of the component leads 6 is measured. The measured locations are compared to the desired pattern either manually or automatically, as by a machine vision system. If misalignment is detected, the machine can be adjusted and retested.

What is claimed is:

1. A method to characterize parametrically the accuracy of component insertion equipment, comprising the steps of:
   (a) providing a test board with a plurality of cavities that are covered by a film and arranged in a known pattern to coincide with the components to be inserted;
   (b) inserting the component leads through the film and into the cavities on the test board according to a desired pattern;
   (c) removing the component leads from the test board;
   (d) measuring the location of the resulting holes in the film caused by the insertion of the component leads; and
   (e) comparing said measured locations to said desired pattern.

2. The method of claim 1 wherein the cavities in step (a) are holes drilled into a test board.

3. The method of claim 1 wherein step (a) comprises laminating the film to the test board.

4. The method of claim 1 wherein the film in step (a) is weak enough to be easily pierced by the component leads during insertion of the component lead.

5. The method of claim 1 wherein the film in step (a) is rigid enough not to tear during insertion and removal of the components and rigid enough to duplicate the shape of the lead resulting from the insertion of the leads.

6. The method of claim 1 wherein each cavity in step (a) is larger in diameter than the hole size normally used to retain the leaded components, and deeper than the length of the component leads.

7. The method of claim 1 wherein step (b) comprises programing the insertion equipment not to clinch the component upon insertion.

8. The method of claim 1 wherein step (d) comprises measuring the location of the resulting holes with a machine vision system.

9. The method of claim 1 wherein step (e) comprises the subsequent step of adjusting the insertion equipment to provide accurate insertion of the components leads.

* * * * *